United States Patent [19]

Hattori et al.

[11] Patent Number: 5,133,561
[45] Date of Patent: Jul. 28, 1992

[54] SEALING DEVICE

[75] Inventors: Hisashi Hattori, Tama; Teruo Iwata, Nirasaki; Hiroshi Sekizuka, Oome; Yoichi Kawauchi, Ageo; Hisao Fujisawa, Nakaminato, all of Japan

[73] Assignees: Tokyo Electron Limited, Tokyo; Tokyo Electron Sagami Limited, Kanagawa; Kishikawa Special Valve Co., Ltd., Tokyo, all of Japan

[21] Appl. No.: 661,109

[22] Filed: Feb. 26, 1991

[30] Foreign Application Priority Data

Feb. 26, 1990 [JP] Japan .................. 2-45211
Mar. 20, 1990 [JP] Japan .................. 2-71562
Aug. 24, 1990 [JP] Japan .................. 2-222872

[51] Int. Cl.[5] .......................... F16J 15/02; F16J 15/48
[52] U.S. Cl. .................................. 277/3; 277/27; 277/72 R; 277/75; 277/79; 285/96; 285/97
[58] Field of Search ............... 277/3, 27, 29, 34, 72 R, 277/75, 76, 79, 236; 285/96, 97, 917

[56] References Cited

U.S. PATENT DOCUMENTS

| | | | |
|---|---|---|---|
| 1,826,941 | 10/1931 | LaMont | 277/1 X |
| 1,888,026 | 11/1932 | Chapman | 277/3 X |
| 2,987,218 | 6/1961 | Erickson et al. | 277/29 X |
| 3,144,035 | 8/1964 | Hablanian | 277/3 X |
| 3,645,545 | 2/1972 | Garnache et al. | 277/72 |
| 4,406,458 | 9/1983 | Maier | 277/3 |
| 4,450,786 | 5/1984 | Doehler et al. | 277/3 X |
| 4,544,317 | 10/1985 | Carter | 277/3 X |
| 4,626,002 | 12/1986 | Hagemeister et al. | 277/27 X |
| 4,726,689 | 2/1988 | Pollock | 277/3 X |
| 4,735,421 | 4/1988 | Neef et al. | 277/34 |
| 4,799,692 | 1/1989 | Batzer et al. | 277/34 |

FOREIGN PATENT DOCUMENTS

| | | | |
|---|---|---|---|
| 3203530 | 8/1983 | Fed. Rep. of Germany | 277/27 |
| 56-59064 | 5/1981 | Japan . | |
| 1216525 | 3/1986 | U.S.S.R. | 277/3 |
| 294538 | 7/1929 | United Kingdom | 277/3 |
| 606032 | 8/1948 | United Kingdom | 277/3 |
| 950062 | 2/1964 | United Kingdom | 277/3 |
| 958345 | 5/1964 | United Kingdom | 277/96 |
| 1375942 | 12/1974 | United Kingdom | 277/3 |

OTHER PUBLICATIONS

Design Parameters for Differentially Pumped Rotating Platforms, Rev. Sci. Instrum. 58(2), Feb. 1987.

Primary Examiner—William A. Cuchlinski, Jr.
Assistant Examiner—Scott W. Cummings
Attorney, Agent, or Firm—Oblon, Spivak, McClelland, Maier & Neustadt

[57] ABSTRACT

A sealing device of this invention is designed to prevent entering of the open air through a coupling of a process tube of a CVD apparatus. The sealing device includes a first flange having a mirror-finished face, a second flange having a face which is brought into contact with the face of the first flange, at least one gas guide which is open to at least one of the faces of the first and second flanges and an evacuation system for evacuating a region, in which the first and second flanges are brought into contact with each other, through the gas guide.

14 Claims, 11 Drawing Sheets

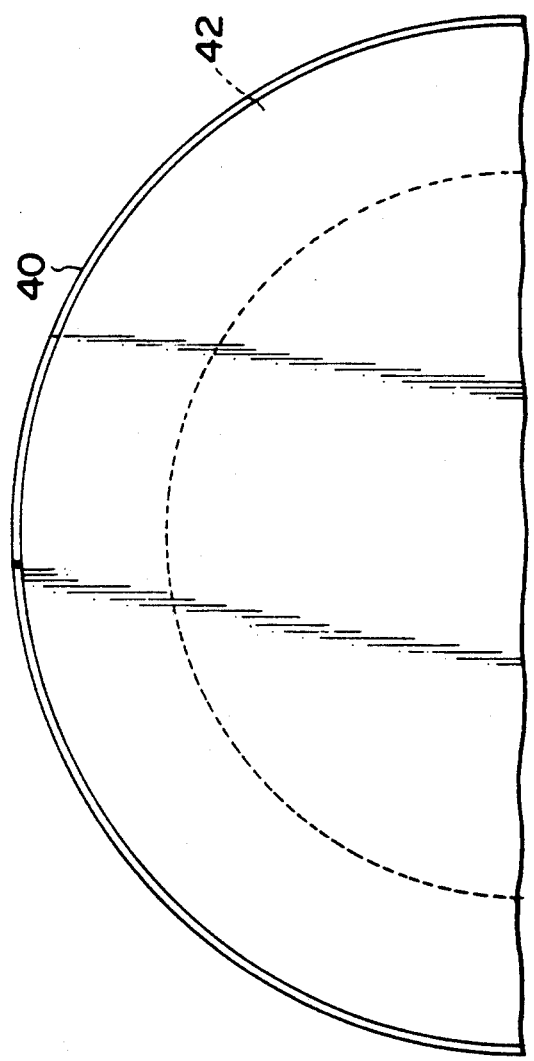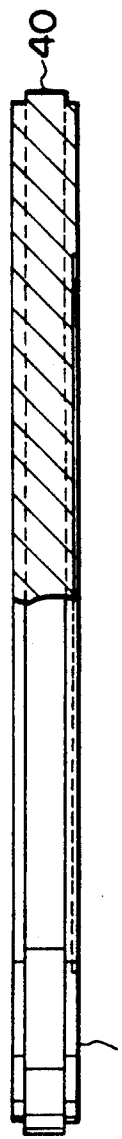
F I G. 5
F I G. 6

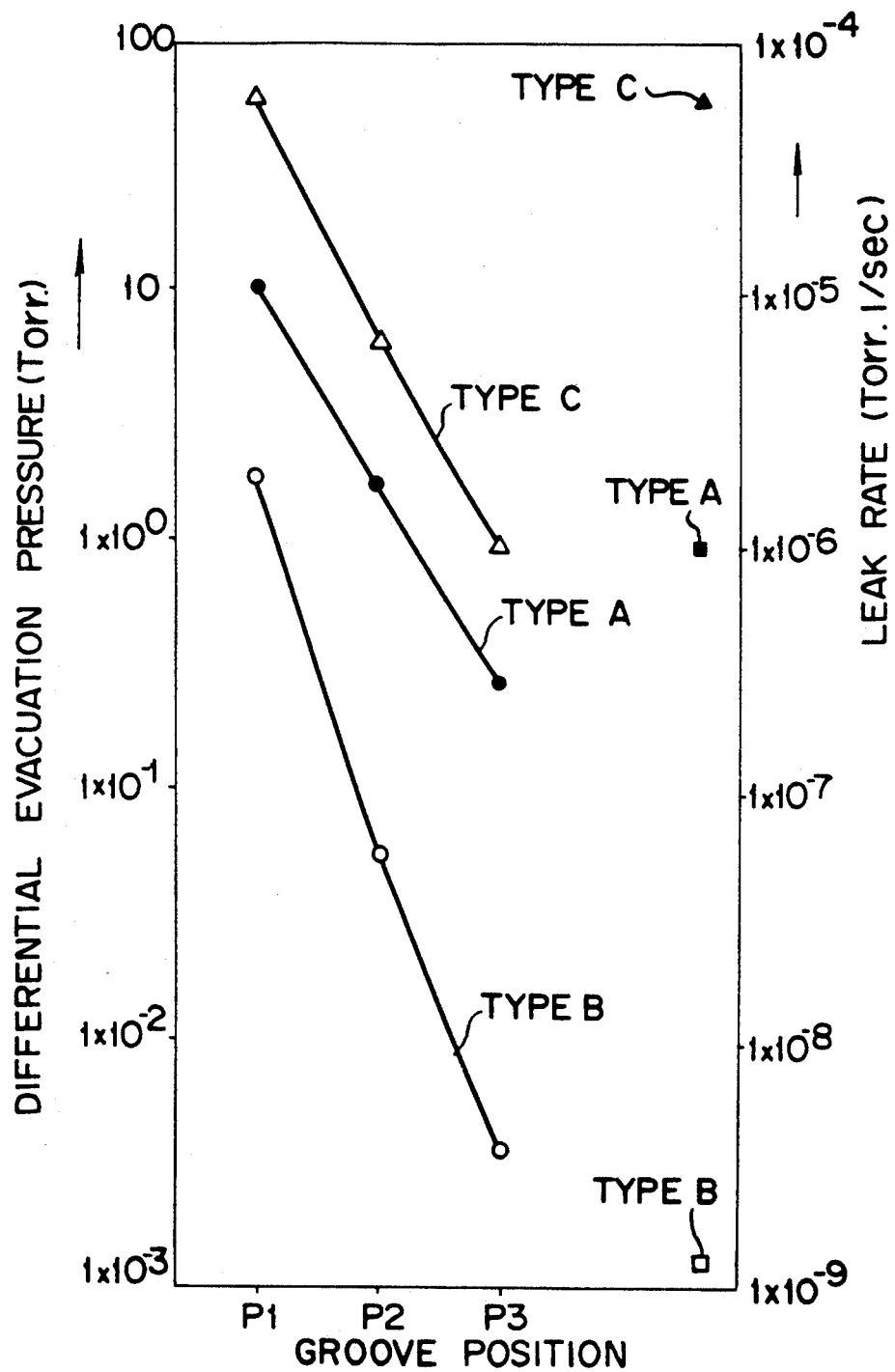
F I G. 14

SEALING DEVICE

BACKGROUND OF THE INVENTION

1. Field of the Invention

The present invention relates to a sealing device used at a seal portion of a member for shielding one gas atmosphere from the other gas atmosphere and, more particularly, to a sealing device used at a coupling portion of a wall for shielding the process atmosphere of a heat treatment apparatus from the open air.

2. Description of the Related Art

In an early operating state, the internal pressure of a process tube of a CVD apparatus is normally set to be smaller than $10^{-3}$ Torr. For this reason, a furnace wall coupling of the CVD apparatus has a seal structure constituted by a seal member such as an O-ring so as to prevent the open air from entering the process atmosphere through a slight gap in the coupling.

A sealing mechanism constituted by a combination of seal rings and an evacuation groove is disclosed in "Design parameters for differentially pumped rotating platforms", Rev. Sci. Instrum. 58(2), February 1987, p. 309, p. 310, U.S. Pat. No. 4,726,689.

As shown in FIG. 1, the above-mentioned sealing mechanism is formed by assembling coupling flanges 2 and 3. A plurality of seal rings 4 are inserted between flange 2 and flange 3, while a intermediate space 5 is formed between one seal ring 4 and other seal ring 4. Each seal ring consists of a resin member incorporating a spring. The intermediate space 5 is formed to be coaxial and parallel with the seal rings 4 and communicates with a suction portion of a vacuum pump through a path 6. In this sealing mechanism, a seal effect is obtained from a synergistic effect combined of the shielding effect by seal rings 4 and the evacuation effect by pumping through the intermediate space 5.

The seal ring 4 of such a type, however, is generally composed of a flexible fluororubber or an ethylene fluoride resin. These materials have heat resistance temperatures of about 200° C. at best. Therefore, if the operation temperature of the heat treatment apparatus exceeds the heat resistance temperature of the seal ring 4, the seal ring 4 is thermally deformed. As a result, a desired seal effect cannot be obtained. For this reason, portions near the seal rings 4 must be forcibly cooled to protect them.

In a CVD apparatus, if an O-ring (seal ring) coupling portion is forcibly cooled, deposits (reacted product) of process gas components are produced on an inner wall portion of a process tube near the coupling, resulting in a nonuniform temperature distribution in the process tube. In order to prevent the cooled coupling portion from influencing a uniform temperature zone, the process tube must be elongated. This undesirably increases the longitudinal size of the CVD apparatus.

In addition, each O-ring is set in a semi-molten state by heating during an operation. When the CVD apparatus is stopped to replace the O-ring with a new one, since the O-ring adheres to the contact face of flange, it is difficult to detach the flanges from each other. When this O-ring is detached, a quartz process tube may be damaged.

Furthermore, in an initial stage in the use of the sealing device, when the O-rings are heated, moisture and components contained in the O-rings are evaporated as gases. The gases and moisture evaporated from the O-ring adversely affect the atmosphere in the process tube to cause variations in quality among process lots.

Moreover, in a reduction heat treatment for removing natural oxide films from semiconductor wafers by using process gases such as monosilane (SiH$_4$), even if the process tube is sufficiently evacuated by using a vacuum pump, gases and moisture evaporated from the O-rings cannot be neglected. This makes it difficult to perform a desired treatment of the semiconductor wafers.

In addition, assume that evacuation is performed by using both a mechanical pump and an ion pump. In this case, since the ion pump functions from the order of $10^{-3}$ Torr, roughing is performed first by the mechanical ion pump. Therefore, a relatively long period of time is required to obtain a seal effect.

SUMMARY OF THE INVENTION

It is an object of the present invention to provide a sealing device which can effectively prevent the open air from entering a process atmosphere without producing undesirable foreign materials such as gases which contaminate the process atmosphere. More specifically, it is an object of the present invention to provide a sealing device, in a heat treatment apparatus, which can be used in a thermally stable state from the initial period of the use of the device.

The present inventors have conducted various studies on a mechanism capable of sealing a coupling portion of a heat treatment apparatus without using O-rings. As a result, the inventors have developed a sealing mechanism which can prevent a substantial deterioration in seal effect even if coupling flanges are thermally deformed by heating.

According to an aspect of the present invention, a sealing device for preventing a gas from leaking through a coupling of a member for separating a first gas atmosphere from a second gas atmosphere comprises a first sealing member having a first sealing face, a second sealing member having a second sealing face which is in contact with the first sealing face of the first sealing member, at least one gas guide which is open to at least one of the first and second sealing faces of the first and second sealing members, and evacuation means for evacuating a region, in which the first and second sealing members are in contact with each other, through the gas guide.

In this sealing device, since the coupling portion is evacuated, and a pressure at this portion is locally decreased to a pressure lower than a pressure around the portion, entering of a gas from one atmosphere into the other atmosphere is prevented. Especially, if evacuation is performed through a plurality of grooves, a local vacuum is increased in the manner of geometric series. This enhances the seal effect.

Such seal effect is based on the local pressure at the coupling portion and the pressure difference between the first and second gas atmospheres. Such a seal effect is called differential pumping.

In addition, by pressing an elastic member against the face of the opposite flange, the degree of adhesion of the faces is increased. This further increases the seal effect in combination with the differential pumping.

Furthermore, the seal effect is greatly increased by urging the elastic member against an open of the evacuation groove.

If the width of each of the evacuation grooves is excessively increased, the face tends to be deformed. In contrast to this, if the width of each of the grooves is excessively decreased, sufficient evacuation cannot be performed. Thus, the width of each of the grooves is preferably set in a range of 3 to 8 mm.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a view showing a part of a blind flange viewed from the side opposite to the seal surface;

FIG. 6 is a partial sectional view showing the blind flange viewed from a direction perpendicular to the seal surface;

FIG. 14 is a graph showing an experimental result of the differential pumping;

DETAILED DESCRIPTION OF THE PREFERRED EMBODIMENTS

Embodiments of the present invention will be described below with reference to the accompanying drawings.

Figure 1:
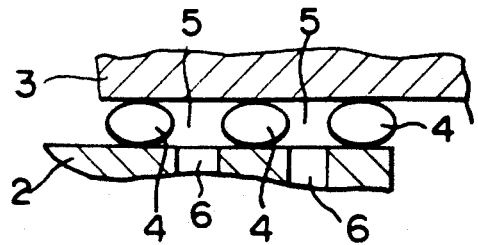
FIG. 1 is a longitudinal sectional view showing a part of a conventional sealing mechanism.
Figure 2:
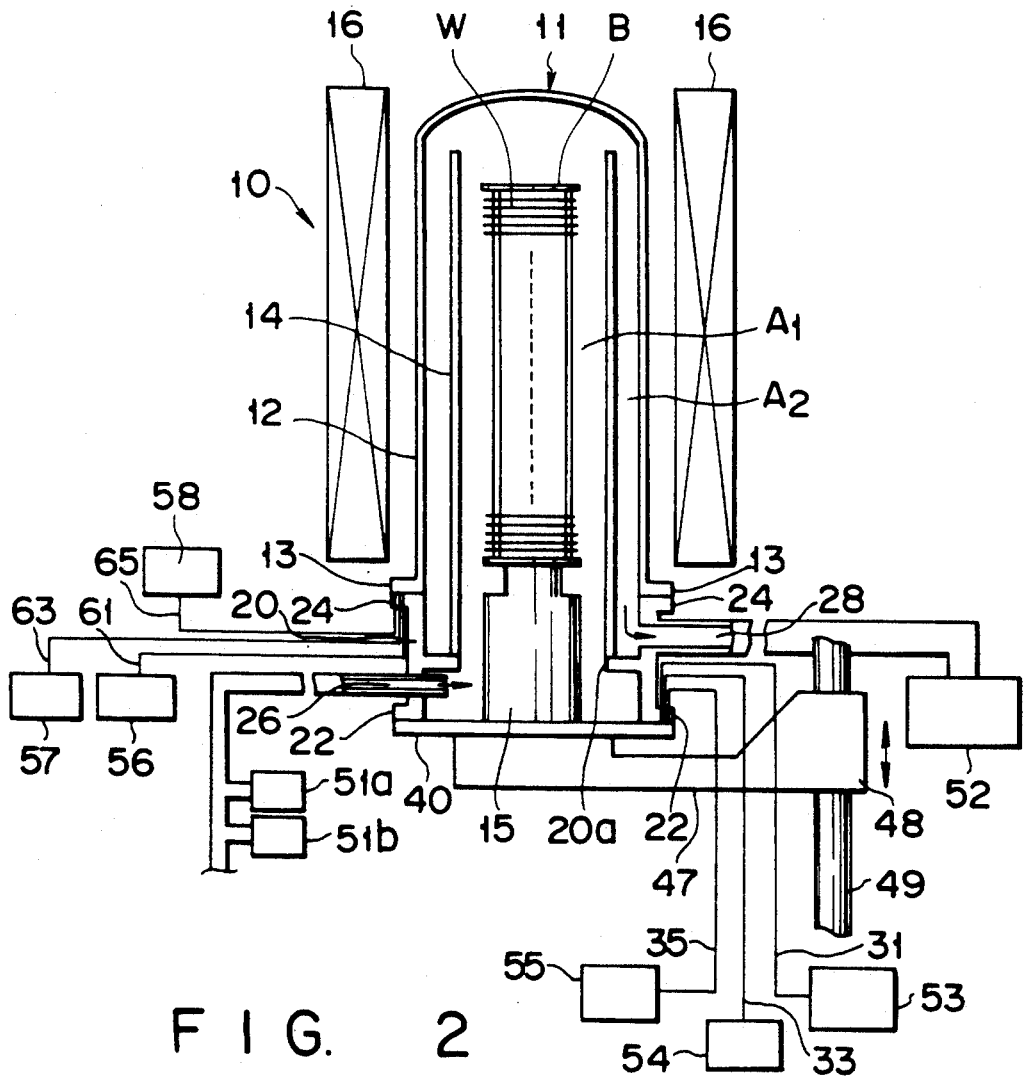
FIG. 2 is a schematic view showing an overall arrangement of a vertical type CVD apparatus having a sealing mechanism according to an embodiment of the present invention.

As shown in FIG. 2, a vertical type CVD apparatus 10 is arranged in a clean room having an air conditioner, and a large number of silicon wafers W mounted on a boat B are subjected to batch processing in a process tube 11. The CVD apparatus 10 is an automatic apparatus backed up by a computer system including a controller (not shown). For example, loading of the boat B, feeding of a process gas, and supply of power to a heater 16 are fully automatically controlled by the controller.

The process tube 11 has a vertical cylindrical shape and is fixed to a frame (not shown) by a support member (not shown). The process tube 11 is surrounded by the heater 16. A power supply (not shown) of the heater 16 is controlled by the controller (not shown) to supply a proper current so as to set a desired temperature in the process tube 11. Note that the heating capacity of the heater 16 is adjusted to set a temperature range of 500° to 1,200° C. in the process tube 11.

The process tube 11 is constituted by a quartz main tube 12 and a stainless steel manifold 20. The manifold 20 need not be made of a metal and may be made of quartz, SiC and other ceramic material.

A flange 13 is formed on a lower opening end portion of the main tube 12. The flange 13 is connected to an upper flange of the cylindrical manifold 20.

A lid member (blind flange) 40 is urged against a lower flange 22 of the manifold 20 to seal the lower opening of the process tube 11.

An annular projection 20a is formed on the inner surface of the manifold 20. A cylindrical partition 14 is supported by the annular projection 20a. The interior of the process tube 11 is divided into a gas feed area A1 and a gas evacuation area A2 by the cylindrical partition 14.

A gas inlet 26 extends through a lower side wall of the manifold 20 and communicates with the gas feed area A1. The gas inlet 26 communicates with a plurality of gas feed sources 51a, 51b, . . . through pipes. The plurality of gas feed sources 51a, 51b, . . . are used to store various types of gases such as monosilane gas, oxygen gas, hydrogen gas, and nitrogen gas.

A gas outlet 28 extends through an upper side wall and communicates with the gas evacuation area A2. The gas outlet 28 communicates with an evacuation system 52 through a pipe.

A heat-insulating cylinder 15 is mounted on the blind flange 40. The vertical type wafer boat B is mounted on the heat-insulating cylinder 15. The blind flange 40 is supported by a support member 47. A nut 48 of the support member 47 is threadably engaged with a vertical ball screw 49 of an elevating mechanism.

Figure 3:
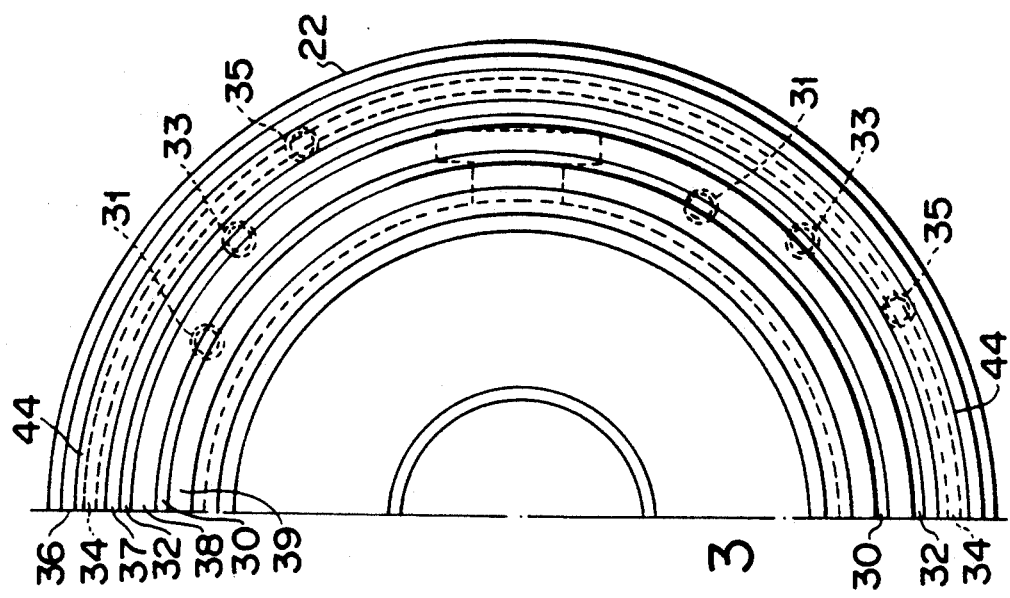
FIG. 3 is a view showing a part of a three-groove type flange viewed from a seal surface.
Figure 4:
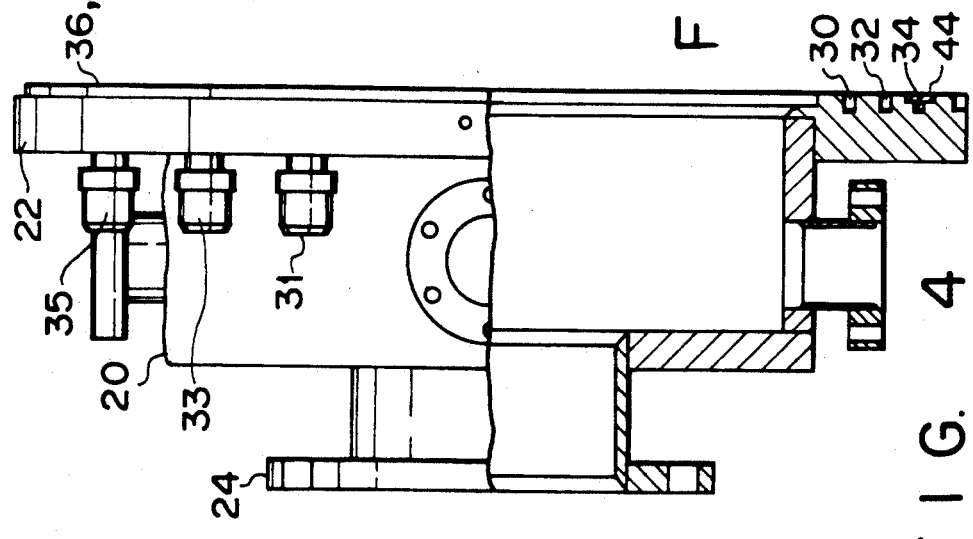
FIG. 4 is a partial sectional view of the three-groove type flange viewed from a direction perpendicular to the seal surface.

As shown in FIGS. 3 and 4, three grooves 30, 32, and 34 are concentrically formed in a face of the lower flange 22 of the manifold 20. The first groove 31 is formed in an innermost portion of the face of the lower flange 22 and communicates with an air evacuation system 53 through a path 31. The second groove 32 is formed in an intermediate portion of the face of the lower flange 22 and communicates with an evacuation system 54 through a path 33. This evacuation system has an evacuation pump.

The third groove 34 is formed in an outermost portion of the face of the lower flange 22 and communicates with a pressurizing system 55 through a path 35. The pressuring system 55 has a gas supply source reserved $N_2$ gas or air. Note that the opening of the third groove 34 is airtightly covered with a thin metal plate 44 throughout the groove. The metal thin plate 44 consists of a corrosion-resistant metal such as silver (Ag), nickel, or stainless steel.

The sizes of the respective components of the lower flange 22 are: the thickness: 30 mm; the outer diameter of the face: 390 mm; the inner diameter of the face: 280 mm; the width of each of the grooves 30, 32, and 34: 5 mm; the depth of each of the grooves 30, 32, and 34: 8 mm; and the pitch of the grooves 30, 32, and 34: 15 mm. In this case, if the width of each of the grooves 30, 32, and 34 is excessively increased, the face tends to be deformed. In contrast to this, if the width of each of the grooves 30, 32, and 34 is excessively decreased, sufficient evacuation cannot be performed. For this reason, the width of each of the grooves 30, 32, and 34 is preferably set to be 3 to 8 mm.

Note that each of face portions 36, 37, 38, and 39 constituting the face of the lower flange 22 is finished to have a surface roughness of ±2 μm or less. The face constituted by these face portions 36, 37, 38, and 39 is finished to have a flatness of ±5 μm or less as a whole.

The thin metal plate 44 has a thickness of 0.1 mm and a width of 10 mm. If the thickness of the metal thin plate 44 is excessively increased, expansion/deformation thereof cannot be easily caused. In contrast to this, if the thickness of the thin metal plate 44 is excessively decreased, the plate 44 becomes susceptible to damage. For this reason, the thickness of the thin metal plate 44 is preferably set to be in the range of 0.05 mm to 0.25 mm. Although a seal effect can be expected to some extent without the thin metal plate 44 in a three-groove type sealing mechanism, the seal effect can be greatly enhanced with the thin metal plate 44.

As shown in FIGS. 5 and 6, a face 42 of the blind flange 40 is finished to have a surface roughness of ±2 μm or less. The face 42 is finished to have a flatness of ±5 μm or less as a whole.

The sizes of the respective components of the blind flange 40 are: the thickness: 15 mm; the outer diameter of the face: 390 mm; and the inner diameter of the face: 280 mm.

Figure 7:
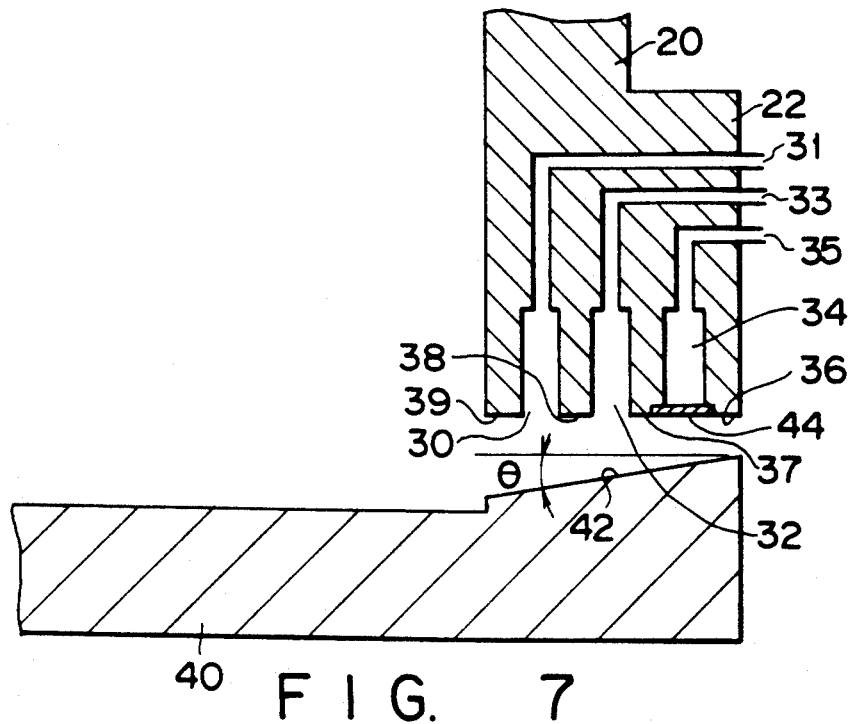
FIG. 7 is a longitudinal sectional view showing portions of a grooved flange and a blind flange constituting a sealing mechanism of the first embodiment of the present invention.

As shown in FIG. 7, the face 42 of the blind flange 40 is inwardly inclined downward from a horizontal plane at an inclination angle θ. The inclination angle θ of the face 42 is set to be an optimal value depending on conditions, e.g., the size of the flange 40, a material for the flange, and a width of the face 42. For example, if the blind flange 40 is constituted by a stainless steel (SUS 316) member having a diameter 300 mm and a thickness of 15 mm, the inclination angle θ is preferably set within a range of 0.01 to 0.1 degrees.

Figure 9:
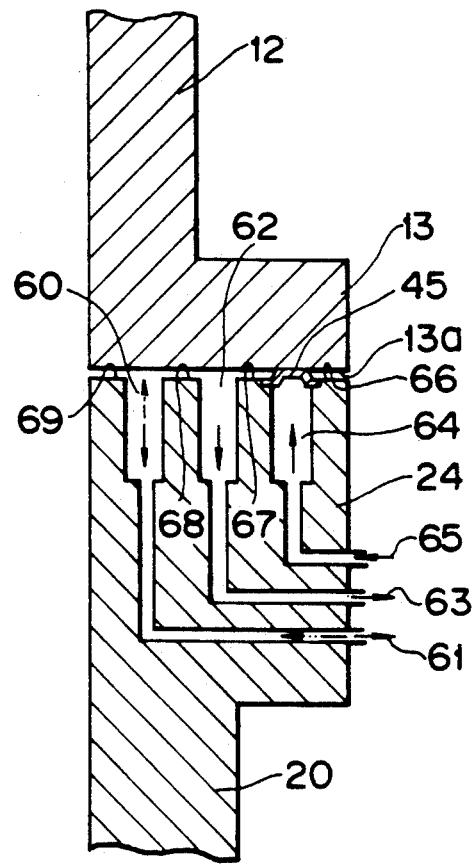
FIG. 9 is a longitudinal sectional view showing a part of a sealing mechanism, in an operation state, according to the second embodiment of the present invention.

As shown in FIG. 9, the flange 13 of the main tube 12 is seal-connected to the upper flange 24 of the manifold 20. Three grooves 60, 62, and 64 are concentrically formed in the face of the upper flange 24 of the manifold 20. The first groove 60 is formed in an innermost portion of the face of the upper flange 24 and communicates with an evacuation system 56 through a path 61. The second groove 62 is formed in an intermediate portion of the face of the upper flange 24 and communicates with an another evacuation system 57 through a path 63. This evacuation system 57 has an evacuation pump.

The third groove 64 is formed in an outermost portion of the face of the upper flange 24 and communicates with a pressuring system 58 through a path 65. The pressurizing system 58 has a gas supply source reserved $N_2$ gas and like. Note that the opening of the third groove 64 is airtightly covered with a thin metal plate 45 throughout the groove. This thin metal plate 45 consists of a corrosion-resistant metal such as silver (Ag), nickel, or stainless steel.

The sizes of the respective components of the upper flange 24 are: the thickness 30 mm; the outer diameter of the face: 390 mm; the inner diameter of the face: 280 mm; the width of each of the grooves 60, 62, and 64: 5 mm; the depth of each of the grooves 60, 62, and 64: 8 mm; and the pitch of the grooves 60, 62, and 64: 15 mm. If the width of each of the grooves 60, 62, and 64 is excessively increased, the face tends to be deformed In contrast to this, if the width of each of the grooves 60, 62, and 64 is excessively decreased, sufficient evacuation cannot be performed. For this reason, the width of each of the grooves 60, 62, and 64 is preferably set in a range of 3 to 8 mm.

Note that each of face portions 66, 67, 68, and 69 constituting the face of the upper flange 24 may not necessary have high flatness, and, in the embodiment, each face portion is finished to have a surface roughness of ±2 μm or less. The face constituted by these face portions 66, 67, 68, and 69 is finished to have a flatness of ±5 μm or less as a whole. The sizes of the respective components of the flange 24 are: the thickness: 30 mm; the outer diameter of the face: 390 mm; and the inner diameter of the face: 280 mm.

The thin metal plate 45 has a thickness of 0.1 mm and a width of 10 mm. In this case, the thickness of the thin metal plate 45 preferably falls within a range of 0.05 mm to 0.25 mm.

A face 13a of the flange 13 of the main tube 12 is finished to have a flatness of ±5 μm or less. The sizes of the respective components of the flange 13 are: the thickness: 30 mm; the outer diameter of the face 13a: 390 mm; and the inner diameter of the face 13a: 280 mm.

An operation of the first embodiment of the present invention will be described below with reference to FIGS. 2, 8, and 9.

(I) Heat treatment conditions are input to a CPU of the computer system by using a keyboard in advance. 150 silicon wafers W are mounted on the wafer boat B. The boat B is loaded in the process tube 11 of the CVD apparatus 10 and is heated by the heater 16. At this time, the interior of the process tube 11 is purged by nitrogen gas beforehand.

(II) The process tube 11 is evacuated by the evacuation system 52. Meanwhile, all the evacuation systems 53, 54, 56 and 57, and the pressurizing systems 55 and 58 of the sealing mechanism are operated. While the first grooves 30 and 60 are respectively evacuated by the evacuation systems 53 and 56, the second grooves 32 and 62 are respectively evacuated by the evacuation systems 54 and 57. Meanwhile, nitrogen gas is fed from the pressurizing systems 55 and 58 into the third grooves 34 and 64 at a pressure of 1 to 5 kg/cm$^2$ to expand the thin plates 44 and 45. As a result, the thin plates 44 and 45 are respectively brought into tight contact with wide regions of the faces 42 and 13a of the opposite flanges, thus increasing the seal effect.

(III) When several to several tens seconds elapse, a normal state is set. In this normal state, the internal pressure of each of the first grooves 32 and 62 becomes about $10^{-2}$ Torr, and the internal pressure of each of the first grooves 30 and 60 becomes about $10^{-4}$ Torr. At this time, the temperatures of the lower flange couplings 22 and 40 reach 200° C. or higher, while the temperatures of the upper flange couplings 13 and 24 reach 300° C. or higher.

Figure 8:
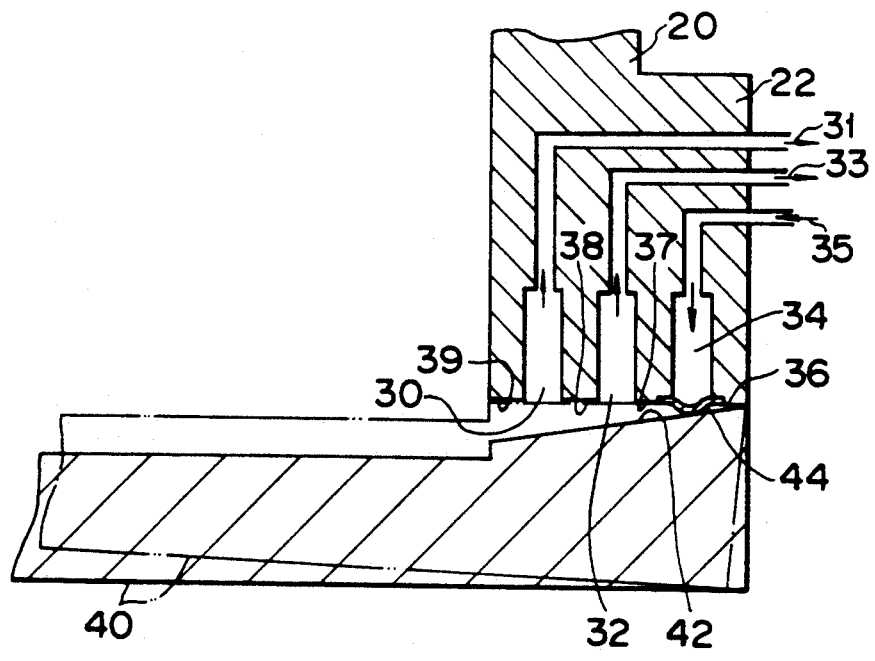
FIG. 8 is a longitudinal sectional view showing a part of the sealing mechanism of the first embodiment in an operation state.

(IV) As indicated by an imaginary line in FIG. 8, when a negative pressure is set in the process tube 11, the blind flange 40 is deformed such that its central portion is recessed. As a result, the face 42 of the flange 40 is brought into further tight contact with the face portions 36, 37, 38, and 39 of the flange 22. This increases the seal effect.

(V) When the internal temperature of the process tube 11 reaches about 1,000° C., monosilane (SiH$_4$) gas is fed from a first gas reservoir 51a into the process tube 11. With this operation, a natural oxide film on each silicon wafer W is reduced to a desired state. Note that an evacuation gas upon reduction reaction and non-reacted process gas components are evacuated by the evacuation system 52 through the lower evacuation port 28.

(VI) Since the sealing mechanism described above exhibits a satisfactory function even at a high temperature, the process tube 11 is evacuated by a turbo molecular pump without flowing process gas. The total leak rate of the process tube 11 can be kept to be a desired value of $10^{-7}$ Torr/s or lower, and no substantial variations in reduction process result of the silicon wafers W are caused.

The third embodiment of the present invention will

In the third embodiment, an annular groove 62 is formed in a flange 13c of a main tube 12c, while an annular groove 64 is formed in an upper flange 24c of opening of the groove 64 on the lower side is covered by an elastic member, e.g., a thin metal plate 46. This thin plate 46 has a thickness of 0.1 to 0.2 mm and consists of stainless steel, nickel, copper, silver, or gold. Alternatively, the thin plate 46 may consist of an insulating material, e.g., Teflon, polyimide, or ceramics, or a semiconductor material, e.g., silicon. The thin metal plate 46 and the opening of the groove 62 on the upper side are positioned to oppose each other. The groove 62 on the upper side communicates with an evacuation system (not shown) through an annular expanded space 70 and a path 63. The groove 64 on the lower side communicates with a pressurizing system (not shown) through a path 65 having a small diameter.

When a pressurized gas is fed into the groove 64 while the flanges 13c and 24c are clamped together by a proper clamping force, the thin plate 46 expands to be urged against the opening of the groove 62 with a large force. As a result, the seal effect between the seal portions 13c and 24c is further enhanced.

The sealing device can be made applicable by only setting an atmospheric pressure in the groove 64 depending on an application purpose. This is because the thin metal plate 46 is firmly sucked by the evacuation pressure of the opposite groove 62.

In each embodiment described above, the main evacuation systems 52 may be partially used for groove evacuation systems.

Figure 11:
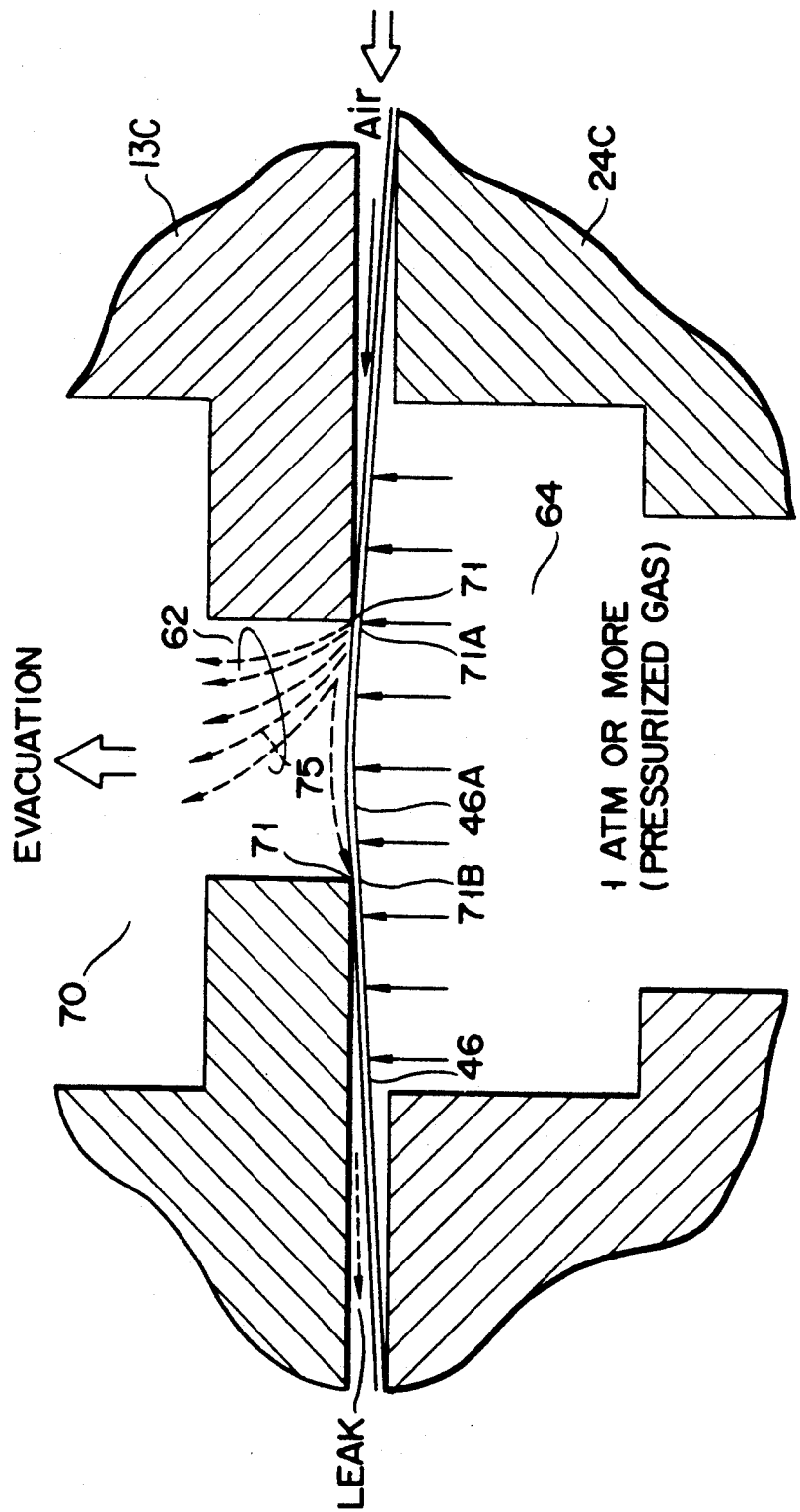
FIG. 11 is an enlarged longitudinal sectional view showing a part of a sealing mechanism, according to the third embodiment.

It is essential that the groove 62 has a smaller width than the opposite groove 64. With this arrangement, a deformed portion 46A (shown in FIG. 11) of the thin metal plate 46 is brought into contact with an edge portion 71 (shown in FIG. 11) of the groove 62 to produce a seal effect. FIG. 11 is an enlarged view of this state. FIG. 11 show a state wherein the groove 62 is evacuated by a vacuum pump or the like to a negative pressure, and the thin metal plate 46 is deformed, so that the deformed portion 46A is brought into contact with the edge portion 71 of the groove 62. More specifically, the thin metal plate 46 is brought into contact with outer and inner ring-like edge portions 71A and 71B formed on the groove 62. Although the contact of the thin metal plate 46 with the outer edge portion 71A can produce a large seal effect, a seal effect closer to perfection can be achieved by a combination of the effect obtained by evacuation of the groove 62 and the seal effect by means of the inner edge portion 71B, in this embodiment, the width of the groove 64 is set to larger than that of the groove 62. However, since the groove 64 is only required to have a space large enough to allow the thin metal plate 46 as an elastic member to be deformed, the width of the groove 62 may be set to be larger than that of the groove 64. In addition, the present invention can be effectively applied to a seal portion between a flange 13c of the quartz main tube (or silica glass vessel) 12 and a flange 24c of the metal manifold 20c, which can tolerate only a limited clamping force, such as a quartz reaction chamber. This effect will be described in detail below.

Figure 10:
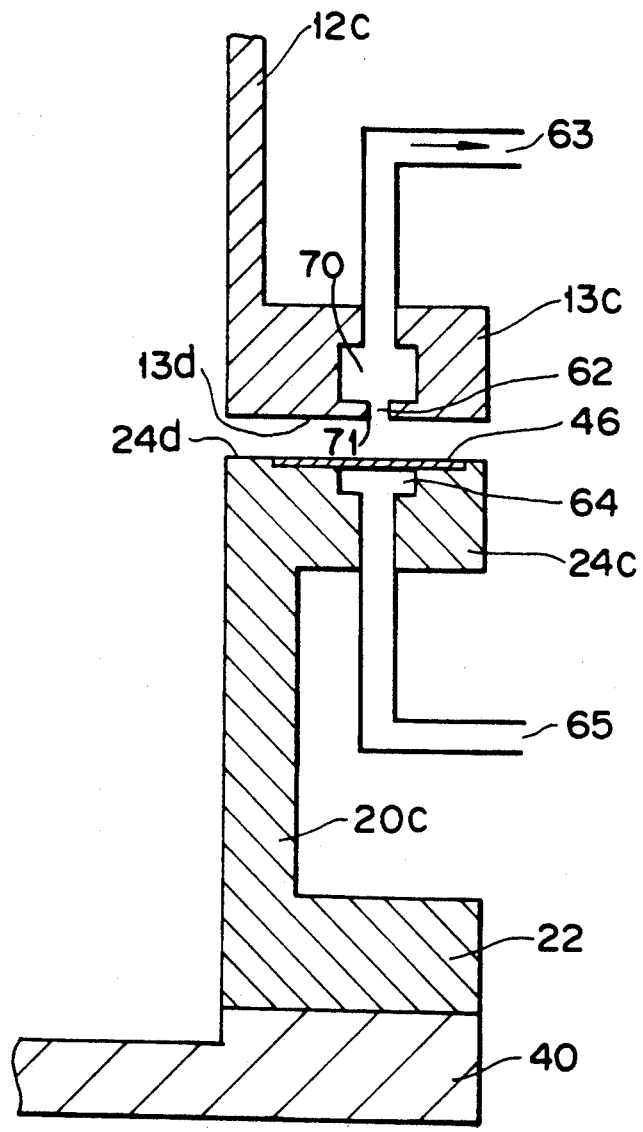
FIG. 10 is a longitudinal sectional view showing a part of a sealing mechanism, arranged on an intermediate coupling, according to the third embodiment.

In the arrangement shown in FIG. 10, a seal surface roughness of each of the flange 13c and the thin metal plate 46 of the flange 24c was set to be about 0.1 μm or less. When a clamping force of 10 to 50 kg/mm was applied to the flanges 13c and 24c, and an inert gas or nitrogen gas (N$_2$), e.g., N$_2$ gas, was fed through the groove 64 at a rate of 5 kg/cm$^2$ without applying suction to the groove 62, the seal effect, i.e., the leak rate was $5 \times 10^{-6}$ Torr. l/s. When no clamping force was applied to the flanges 13c and 24c, and only suction is applied to the groove 62 in an atmospheric pressure state without feeding a gas from the groove 64, the leak rate was $3 \times 10^{-8}$ Torr. l/s. When no clamping force is applied to the flanges 13c and 24c, and N$_2$ gas was fed at a rate of 2 kg/cm$^2$ while applying suction to the groove 62, the leak rate was $1 \times 10^{-8}$ Torr. l/s. When a clamping force of about 2 kg/mm was applied to the flanges 13c and 24c, and N$_2$ gas was fed at a rate of 2 kg/cm$^2$ from the groove 64 while applying suction to the groove 62, the leak rate was $5 \times 10^{-10}$ Torr. l/s.

It was found that the leak rate was increased 100 times or more due the suction effect of the groove 62, and that the leak rate was further increased 10 times or more by only applying a slight clamping force to the flanges 13c and 24c.

Figure 12:
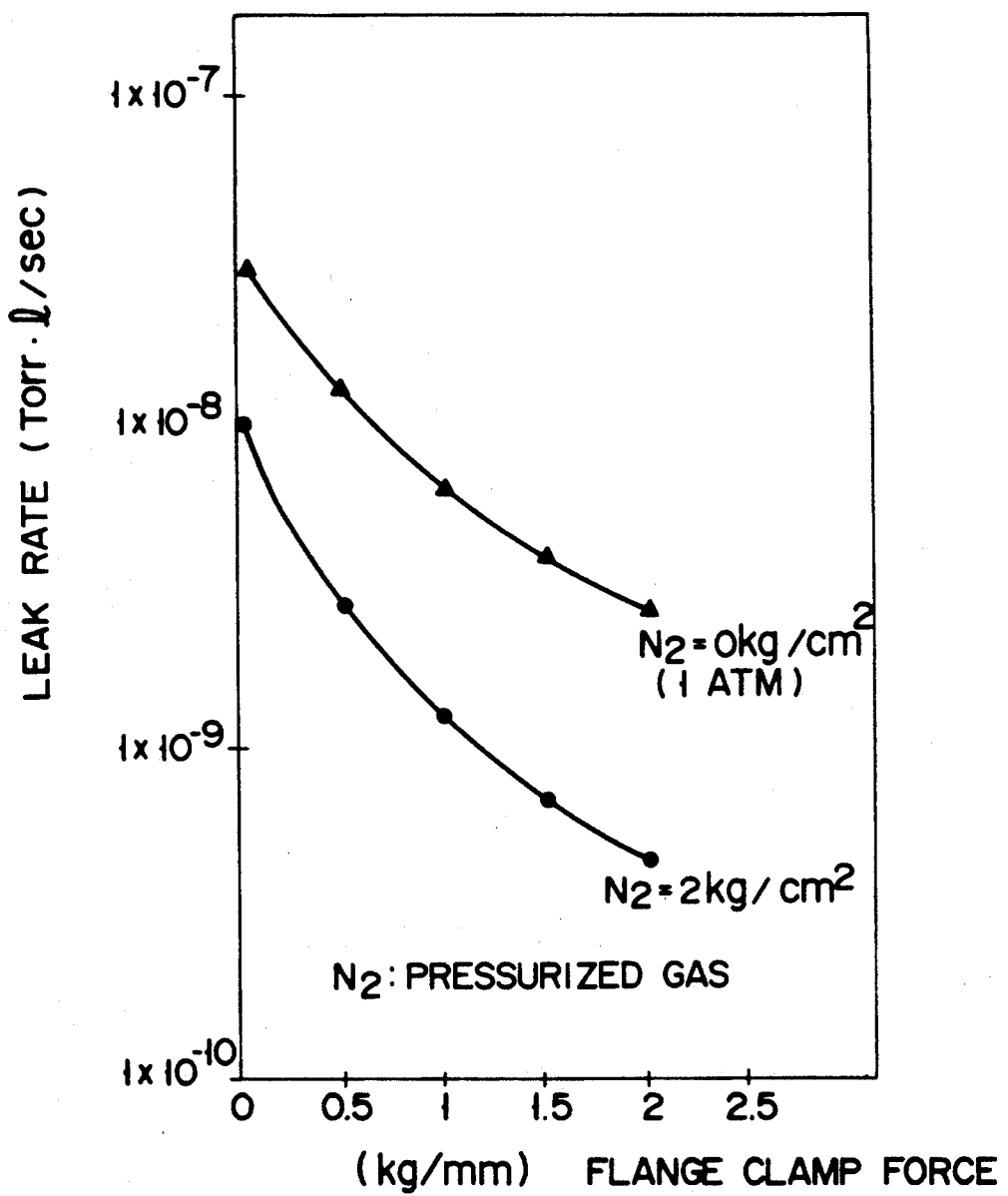
FIG. 12 is a graph showing the relation between a flange clamp force and leak rate.

FIG. 12 shows the effects of such a clamping force. It is apparent that the leak rate is considerably increased even with application of a slight clamping force as compared with a case wherein no clamping force is applied.

Note that a clamping force required for a general metal O-ring is about 10 to 50 kg/mm. It is apparent, therefore, that a sufficient seal effect can be obtained with a clamping force less than 1/10 that of this conventional technique.

In heat treatment furnaces for 6- and 8-inch wafers, the width of the groove 62 is preferably set to be 3 to 8 mm. The width of the groove 62 is determined in accordance with a material for the elastic member. If, for example, 0.2 mm thick elastic member consisting of stainless steel is used, and the width of the groove 62 is set to be smaller than 3 mm, he double seal effect is reduced. If the width of the groove 62 is set to be larger than 8 mm, the service life of the device is shortened because the degree of expansion/contraction of the elastic member is increased.

Furthermore, in addition to an evacuating operation with respect to the groove 62, the groove 64 may be set at an atmospheric pressure or may be pressurized.

The groove 64 can be properly pressurized by feeding air or an inert gas such as N₂ gas.

Moreover, even if the grooves 62 and 64 are formed to have the same width as needed, a seal effect can be obtained.

Results obtained by helium leak tests on various types of three-groove type sealing mechanisms will be described with reference to FIGS. 13 and 14.

Figure 13:
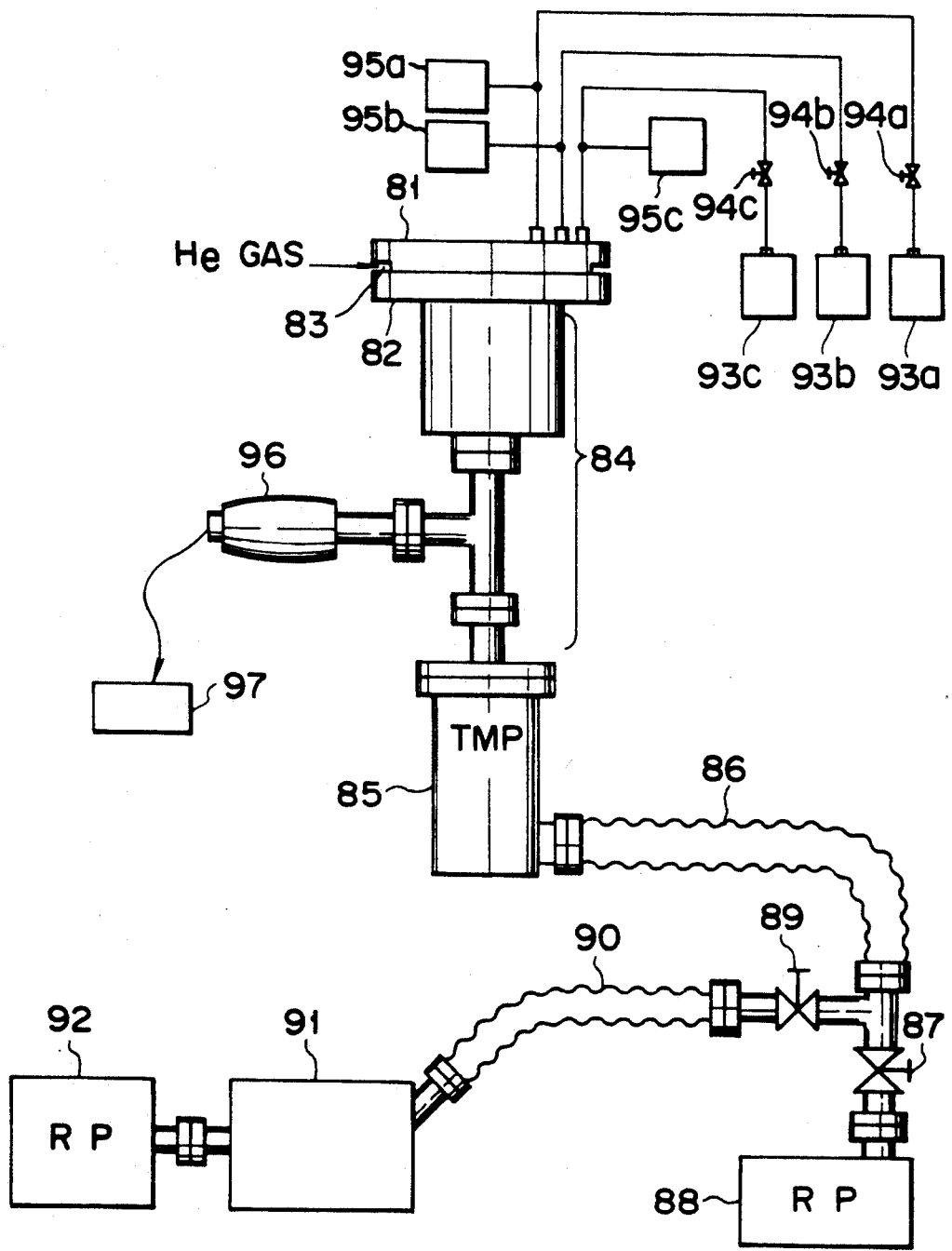
FIG. 13 is a schematic view showing a test apparatus for checking the effect of differential pumping of a sealing mechanism having a three-groove type flange.

Three concentrical grooves are formed in a face of an upper flange 81 of a helium leak test apparatus shown in FIG. 13. As a lower flange 82, a flange having a flat face (see the face 42a in FIG. 10), a flange having a tapered surface inclined inward (see the face 42 in FIG. 7), and a flange having a tapered surface inclined outward (see the face 42 in FIG. 7, which tapered in the opposite direction) are sequentially replaced with each An outer atmosphere of a coupling seal portion 83 between the upper and lower flanges 81 and 82 is filled with helium gas. The upper and lower flanges 81 and 82 are composed of an aluminum alloy.

Internal paths of the lower flange 82 respectively communicate with a turbo-molecular pump (TMP) 85 and a vacuum gauge head 96 through a branch pipe 84. A rotary the downstream side of the TMP 85. The TMP 85 removes gas molecules absorbed in the inner walls of the flanges 81 and 82 and of the pipe 84 so as to stabilize the background of a measuring system.

Another rotary pump 92 is arranged on the downstream side of the helium leak detector 91. Note that a switching valve 87 is arranged in a pipe 86 between the TMP 85 and the rotary pump 88. A switching valve 89 is also arranged in a pipe 90 between the TMP 85 and the helium leak detector 91. A vacuum rate indicator 97 is connected by cable on the vacuum gauge head 96 arranged in a branch path.

The grooves in the upper flange 81 respectively communicate with the inlet ports of rotary pumps 93a, 93b, and 93c. Pressure gauges 95a, 95b, and 95c and valves 94a, 94b, and 94c are arranged in the respective communicating pipes.

The valve 87 is kept open to evacuate the measuring system until the measuring system is stabilized. At the same time, the valves 94a, 94b, and 94c are opened to evacuate the sealing mechanism. When the background of the measuring system is stabilized, the valve 87 is closed, and the valve 89 is opened to evacuate in the direction of the helium detector 91. With this operation, an amount of helium gas leaking into the measuring system through the flange coupling portion 83 is detected.

FIG. 14 is a graph in which the positions of three ring-like grooves are plotted along the axis of abscissa, and differential evacuation pressures and leak rates at the respective groove positions are plotted along the axis of ordinate, thus showing a relationship between an evacuation pressure and a leak rate in each groove in each of the sealing devices shown in FIGS. 2 to 12. That is, this graph shows results obtained by conducting tests using the three types of lower flanges 82 respectively having the flat face (type A) shown in FIGS. 9, 10, and 13A, the tapered face descending inward (type B) shown in FIGS. 7, and 8, and the tapered face descending outward (type B). The inclinations of the types B and C are about several tens $\mu m$. Referring to FIG. 14, a curve plotted along blank circles represents a result associated with the type B; a curve plotted along sold circles, a result associated with the type A; and a curve plotted along triangles, a result associated with the type C. Note that Torr. l/sec used as a unit of leak rate is converted into a helium leak amount of $3.54 \times 10^{19}$ per second at a temperature of 0° C.

In addition, as is apparent from FIG. 14, the best result is obtained when the flange having the tapered face descending inward (type B) is used. In this case, $5.3 \times 10^{-3}$ Torr was obtained at the innermost position (P3), and the leak rate of about $1 \times 10^{-7}$ Torr. l/s was obtained.

Figure 15:
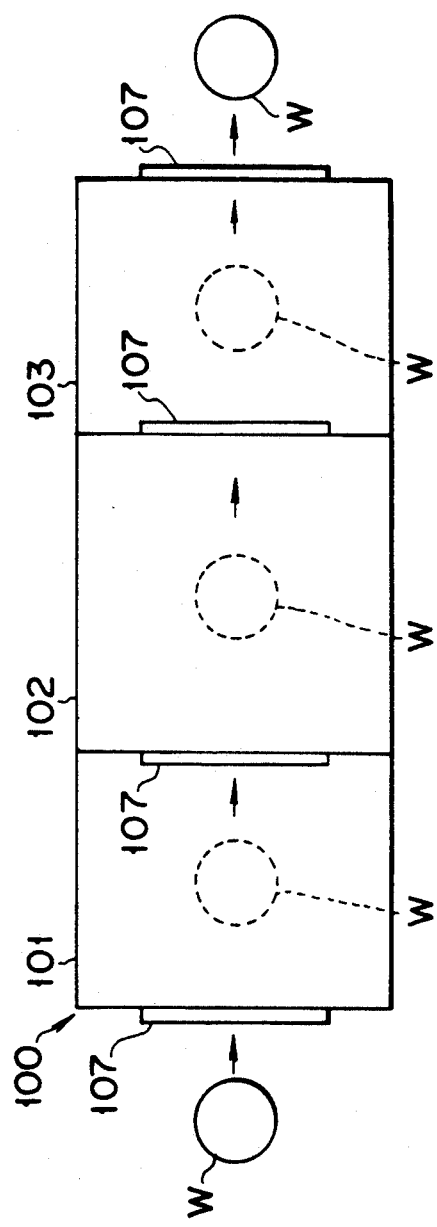
FIG. 15 is a schematic plan view showing an overall arrangement of an etcher/sputtering system having a sealing mechanism according to the fourth embodiment of the present invention.
Figure 16:
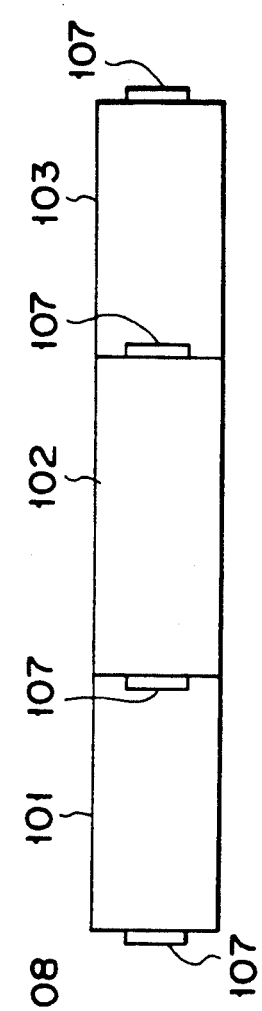
FIG. 16 is a schematic side view showing an overall arrangement of the etcher/sputtering system.

A sealing mechanism of the fifth embodiment of the present invention will be described below with reference to FIGS. 15 to 17, which is applied to a load lock chamber of an etcher/sputtering system.

The etcher/sputtering system has a plurality of process chambers 101, 102, and 103. Load locks 107 are respectively attached to openings 111 of partition walls 108 of the chambers 101, 102, and 103. Each of the chambers 101, 102, and 103 is airtight and is evacuated by an evacuation unit (not shown).

The load locks 107 serve to load/unload silicon wafers W in/from the chambers 101, 102, and 103, respectively. The load locks 107 are frequently opened and closed. For this reason, the load locks 107 are designed to completely prevent the open air and dust from entering the chambers 101, 102, and 103 during a process of the silicon wafers W and to be quickly opened/closed during a non-process period.

Figure 17:
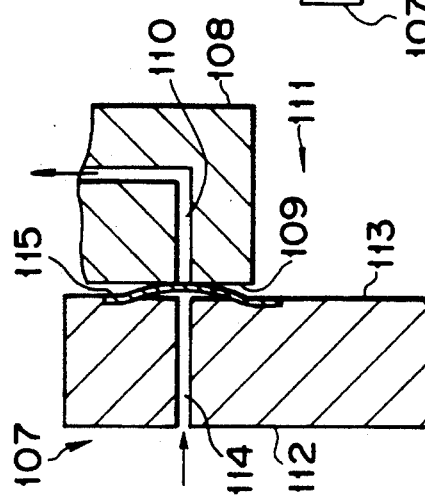
FIG. 17 is an enlarged sectional view showing a part of a sealing mechanism used for a load lock chamber.

As shown in FIG. 17, a door 112 of each load lock 107 is formed to seal the opening 111 of the partition wall 108 and to be freely opened and closed. The door 112 and the partition wall 108 are formed from stainless steel. Faces 115 and 109 of the door 112 and the partition wall 108 are mirror-finished. A groove 114 is formed near a peripheral portion of the door 112 so as to be open to the face 113. The groove 114 communicates with a pressurized gas feed source (not shown). Note that the pressure of a gas fed from the pressurized gas feed source need not be higher than the atmospheric pressure as long as it is larger than the pressure at the groove 110 in the partition wall 108.

The opening of the groove 114 is covered by a thin metal plate 115. The thin metal plate 115 is welded/fixed to an entire peripheral face portion of the door 112. This thin metal plate 115 has a thickness of 0.2 mm and consists of a corrosion-resistant metal such as silver (Ag), nickel, or stainless steel.

A groove 110 is formed in each partition wall 108 near the opening 111 so as to be open to the face 109. When the door 112 is closed, the thin metal plate 115 is brought into contact with the opening of the groove 110. Each groove 110 communicates with an evacuation system (not shown).

The silicon wafers W are inserted in the chamber 101. The door 112 of the load lock 107 is then closed to evacuate the chamber 101. In this case, the groove 110 of the partition wall 108 is evacuated at about $10^{-3}$ Torr or less, while a pressurized gas is fed into the groove 114 of the door 112 at a pressure of 2 kg/cm² or atmosphere. The thin metal plate 115 is pressed by differential of internal pressure of groove 110 and that of groove 114 to expand so as to be brought into tight contact with the opening of the groove 110. As a result, the internal pressure of the chamber 101 becomes a desired pressure of $10^{-6}$ to $10^{-8}$ Torr by using turbo molecular pump.

Since such a load chamber requires only one evacuation system and one pressurizing system, a simple structure can be realized, and the apparatus can be reduced in size.

In addition, since all the components are not composed of an ethylene fluoride resin or the like but are composed of metal materials, even if the doors 112 are frequently opened/closed in a high-temperature, highly corrosive atmosphere, a deterioration in a sealing mechanism can be suppressed, thus allowing long-time use of the apparatus in a stable state above-described load lock mechanism, and a clamping force for pressing the door 112 against the partition wall 108, and the pressure of a pressurized gas were variously changed.

TABLE 1

| No. | Clamping Force $(kg/cm^2)$ | Gas Pressure $(kg/cm^2)$ | Leak Rate (Torr. l/sec) |
|---|---|---|---|
| 1 | 3.54 | 5 | $5.5 \times 10^{-11}$ |
| 2 | 3.54 | 2 | $5.5 \times 10^{-11}$ |
| 3 | 2.50 | 2 | $1.3 \times 10^{-10}$ |
| 4 | 1.50 | 2 | $2.0 \times 10^{-10}$ |
| 5 | 0.50 | 2 | $3.2 \times 10^{-10}$ |
| 6 | 0 | 2 | $8.0 \times 10^{-10}$ |
| 7 | 0 | 1 | $1.2 \times 10^{-9}$ |
| 8 | 0 | 0 | $2.4 \times 10^{-8}$ |

The reason why the clamping forces of Nos. 6 to 8 are zero is that the internal pressure of the chamber is negative, and the door 112 is drawn to the partition wall 108 due to a pressure difference.

As is apparent from the above result, the minimum leak rate is obtained by the conditions of No. 2, and an optimal gas pressure is about 2 $kg/cm^2$ Note that since the door or the partition wall is deformed with an clamping force is limited.

The effects and applications of the present invention will be summarized below.

Since no O-rings are used for the sealing mechanism of the present invention, a stable sealing function can be maintained for a long period of time. Especially, the sealing mechanism can be effectively applied to a flange coupling portion of a heat treatment apparatus because the portion is heated to a high temperature.

The sealing mechanism of the present invention can be applied to a vacuum CVD furnace, an atmospheric CVD furnace, a diffusion furnace, an etching apparatus, and the like. In addition, the sealing mechanism can be applied to an ion implanter, a spin coater apparatus, and the like. #

If the sealing mechanism of the present invention reduction rate of semiconductor wafer surfaces can be greatly reduced as compared with a conventional sealing mechanism. Therefore, a semiconductor having desired quality can be obtained, and the fraction defective can be reduced, thus greatly increasing the yield of products.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A sealing device for preventing a gas from leaking through a coupling of a member for separating a first gas atmosphere from a second gas atmosphere, comprising:

a first sealing member having a first sealing face;

a second sealing member having a second sealing face to contact with the first sealing face;

a first gas guide which is open to the second sealing face;

a second gas guide which is open to the second sealing face and maintained at a pressure equal to or higher than at least the atmospheric pressure;

an evacuating means for evacuating a region, in which said first and second sealing members are in contact with each other, through said first gas guide; and an elastic member which can be deformed by a difference between internal pressure and external pressure and covers the opening of the second gas guide;

wherein the opening of the first gas guide is narrower than the opening of the second gas guide covered with said elastic member, and said elastic member is drawn to the opening of the first gas guide by suction.

2. A device according to claim 1, wherein the first gas atmosphere is a heated atmosphere surrounded by an airtight vessel.

3. A device according to claim 1, wherein the first gas atmosphere is a negative pressure atmosphere surrounded by an airtight vessel.

4. A device according to claim 1, wherein the second gas atmosphere is an atmospheric pressure atmosphere.

5. A device according to claim 1, wherein said elastic member is covered on an opening of one of the guides, which is located farthest from the first gas atmosphere.

6. A device according to claim 1, further comprising clamping means for clamping said first and second sealing members together.

7. A device according to claim 1, wherein said elastic member has a thin metal plate.

8. A device according to claim 1, wherein said first sealing face is made of silica glass.

9. A device according to claim 1, wherein one of said first and second sealing members is a blind flange.

10. A device according to claim 1, wherein both said first and second sealing members are cylindrical flanges.

11. A device according to claim 1, further comprising means for supplying a pressurizing gas to the second gas guide.

12. A device according to claim 1, further comprising means for pressing the second sealing member against the first sealing member.

13. A device according to claim 1, wherein said elastic member comprises a plate selected from the group consisting of a stainless steel plate, a silver plate and a nickel plate.

14. A device according to claim 1, wherein said first sealing member is a flange of the main process tube of a reduced pressure CVD apparatus, and said second sealing member is a flange of the manifold of a reduced pressure CVD apparatus.

* * * * *